United States Patent
Blumhagen et al.

(10) Patent No.: US 10,317,488 B2
(45) Date of Patent: Jun. 11, 2019

(54) METHOD AND MAGNETIC RESONANCE SYSTEM FOR FAT SATURATION

(71) Applicant: Siemens Aktiengesellschaft, München (DE)

(72) Inventors: Jan Ole Blumhagen, Erlangen (DE); Dominik Paul, Bubenreuth (DE); Daniel Nico Splitthoff, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 1091 days.

(21) Appl. No.: 14/661,238

(22) Filed: Mar. 18, 2015

(65) Prior Publication Data

US 2015/0268318 A1    Sep. 24, 2015

(30) Foreign Application Priority Data

Mar. 18, 2014    (DE) .................. 10 2014 204 996

(51) Int. Cl.
  *G01R 33/48*    (2006.01)
  *G01R 33/34*    (2006.01)
  *G01R 33/56*    (2006.01)
  G01R 33/483    (2006.01)

(52) U.S. Cl.
  CPC ......... *G01R 33/4828* (2013.01); *G01R 33/34* (2013.01); *G01R 33/5607* (2013.01); *G01R 33/4835* (2013.01)

(58) Field of Classification Search
  CPC ............ G01R 33/4828; G01R 33/5607; G01R 33/34; G01R 33/4835; G01R 33/4838; G01R 33/543
  See application file for complete search history.

(56) References Cited

U.S. PATENT DOCUMENTS

| | | | |
|---|---|---|---|
| 2005/0030024 A1* | 2/2005 | Golay | G01R 33/4828 324/307 |
| 2009/0091324 A1* | 4/2009 | Sugiura | G01R 33/4828 324/309 |
| 2013/0088226 A1 | 4/2013 | Miyazaki | |
| 2013/0194265 A1* | 8/2013 | Rehwald | G01R 33/4828 345/424 |

FOREIGN PATENT DOCUMENTS

JP    2007203106 A    8/2007

OTHER PUBLICATIONS

Lauenstein et al., "Evaluation of Optimized Inversion-Recovery Fat-Suppression Techniques for T2-Weighted Abdominal MR Imaging," Journal of Magnetic Resonance Imaging, vol. 27 (2008), pp. 1448-1454.

Del Grande et al., "Fat-Suppression Techniques for 3-T MR Imaging of the Musculoskeletal System," Radiographics; Imaging Physics, vol. 34 (2014), pp. 217-233.

* cited by examiner

*Primary Examiner* — Rishi R Patel
(74) *Attorney, Agent, or Firm* — Schiff Hardin LLP

(57) ABSTRACT

In a method and a magnetic resonance system for fat saturation when acquiring magnetic resonance data in a predetermined volume segment of an examination object, a SPAIR pulse is emitted and an RF excitation pulse is emitted following a predetermined time period after the SPAIR pulse, and magnetic resonance data are thereafter acquired. The time period of at least one slice is set so as to be different from the time period for the remaining slices.

13 Claims, 5 Drawing Sheets

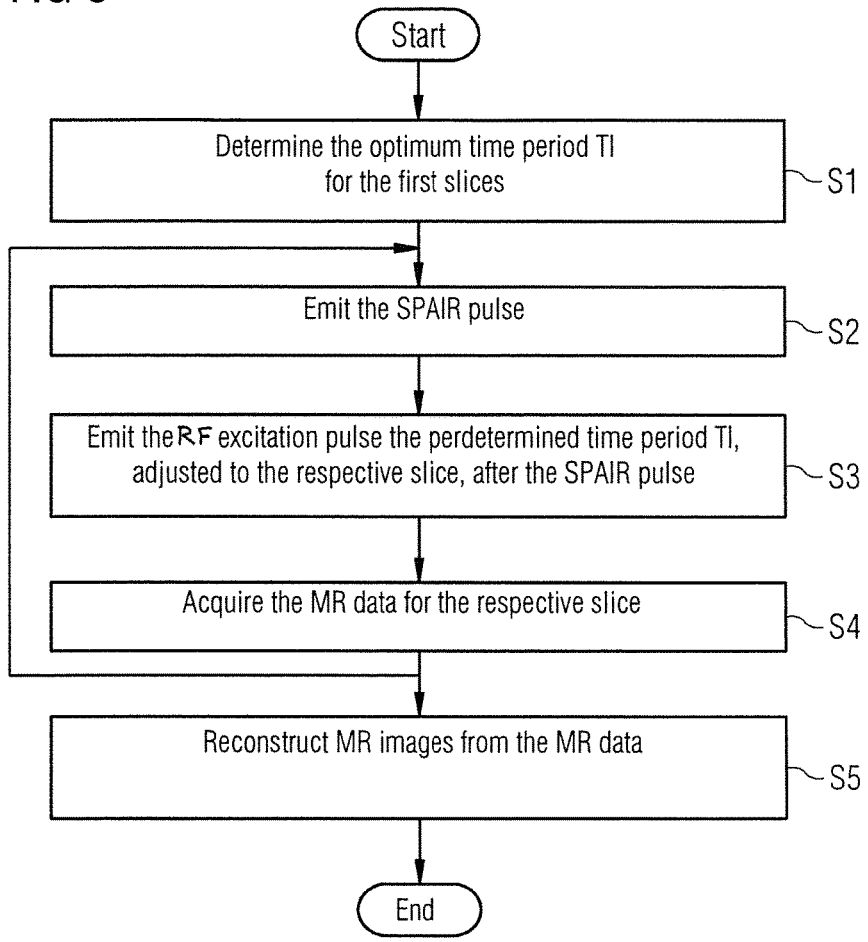

METHOD AND MAGNETIC RESONANCE SYSTEM FOR FAT SATURATION

BACKGROUND OF THE INVENTION

Field of the Invention

The present invention relates to a method and a magnetic resonance system, in order to perform fat saturation when acquiring MR data.

Description of the Prior Art

Several methods for fat saturation are known, including a method that operates with a so-called SPAIR pulse. The SPAIR pulse ("Spectrally Adiabatic Inversion Recovery") is a frequency-selective adiabatic inversion pulse that is emitted in order to invert only spins of fat tissue. The actual RF excitation pulse is emitted a particular time period TI after the SPAIR pulse. Conventionally, the time period TI is selected to be constant so that the longitudinal magnetization of the spins of the fat tissue has as little effect as possible when the MR data is acquired.

When the MR data are acquired in slices, significantly poorer fat saturation may occur in the case of slices acquired first in time compared to the slices acquired subsequently in time, as a function of particular measurement parameters. This different fat saturation then disadvantageously results in an inhomogeneous and disruptive intensity distribution of the fat signal within the reconstructed MR images.

SUMMARY OF THE INVENTION

An object of the present invention is to improve, in comparison to the prior art, fat saturation when MR data is acquired in slices.

Within the scope of the present invention, a method is provided for fat saturation when acquiring MR data in slices in a predetermined volume segment of an examination object with the aid of a magnetic resonance system, that includes the following steps:

Emitting a SPAIR pulse.

Emitting an RF excitation pulse. The RF excitation pulse is emitted a predetermined time period after the SPAIR pulse emitted immediately before it in time.

Acquiring the MR data.

For only one slice, or for multiple slices, the time period between the SPAR pulse and the RF excitation pulse is set so as to be different from the time period that is set for the remaining slices.

Variable setting of the time period makes it possible for the time period between the SPAR pulse and the RF excitation pulse to be set individually (e.g. optimized) for each slice. In this way, the fat saturation of each slice can be improved in comparison to the prior art. According to the invention it is also possible, for example, to set the fat signal or the fat saturation of defined slices to a defined value compared to the other slices (i.e. also intentionally to set it to a worse value, for example) by setting the time period between the SPAR pulse and the RF excitation pulse correspondingly. If the setting of such a defined fat signal is desired, for example for those slices whose MR data is acquired at the mid-point of the time interval in which the data for all the slices is acquired, then the time period for the at least one slice whose MR data is acquired at the mid-point of this time interval is set so as to be different from the time period for the remaining slices. According to the invention, each slice may, in an extreme case, have an individual time period such that no time period for one slice corresponds to the time period for another slice.

Preferably, however, only the time period for the at least one slice whose MR data is acquired first in time is set differently in comparison to the time period for the remaining slices.

The setting of the time period in the case of the slice(s) is performed as a function of a predetermined requirement for a fat signal that is acquired by the magnetic resonance system through the acquisition of the MR data in the volume segment. The requirement for the fat signal is a requirement for a fat saturation in the volume segment or in the acquired slices.

Here, the requirement for the fat signal or for the fat saturation is that the fat saturation be as uniform as possible in each slice (i.e. the fat saturation is as similar as possible in all slices). However, the requirement for the fat signal may also a fat saturation in each slice that is as good as possible. According to the invention, it is also possible for the requirement for the fat signal to be a worse fat saturation for the at least one slice.

If the individual time period is set particularly for the slices acquired first in time such that each slice has substantially the same fat saturation, an inhomogeneous intensity distribution of the fat signal can advantageously be avoided within the reconstructed MR images. In this way, a fat saturation according to the prior art can be avoided, namely a fat saturation that varies greatly in the direction of the slices, as a result of which fat is represented with differing brightness in the reconstructed MR images depending on the order (sequence) in which the data for the slices were acquired.

According to a preferred inventive embodiment, the time period for the remaining slices is determined based on a function. This function itself determines, as a function of a time gap between two SPAR pulses adjacent in time, a further time period which for the remaining slices corresponds to the time period between the SPAR pulse and the RF excitation pulse.

If the time gap between two SPAIR pulses adjacent in time is not constant, the time gap between the SPAIR pulse before the RF excitation pulse and the SPAIR pulse immediately preceding it in time is the critical time gap depending on which the further time period (and thus the time period between the SPAIR pulse and the RF excitation pulse) is determined by means of the function.

In this embodiment, the time period between the SPAR pulse and the RF excitation pulse is preferably set for the at least one slice so as to be greater or longer than the further time period and/or the time period for the remaining slices. However, it is also possible to set the time period between the SPAR pulse and the RF excitation pulse so as to be smaller or shorter for the at least one slice.

If the time gap between the SPAR pulses is small (large), the fat signal value is small (large) in the direction of the basic magnetic field (this applies at least when a continuous fat saturation can be assumed, i.e. if some SPAR pulses have already been emitted). As a result, the fat signal also relaxes faster (more slowly) in the direction of the basic magnetic field after inversion by the SPAIR pulse (i.e. the end state (thermal equilibrium) is reached faster (more slowly)), so the time period selected between the SPAIR pulse and the RF excitation pulse must be small (large).

However, the dependency of the time period on the time gap between the SPAIR pulses applies only if continuous fat saturation is present, i.e. after some of the SPAR pulses have already been emitted, as indicated above. The fewer SPAIR pulses that have previously been emitted, the greater the time interval from the time of emission of the SPAR pulse to the time up to which the fat signal inverted by the SPAIR pulse has the value 0 in the direction of the basic magnetic field. The time period for the at least one slice for which MR data is acquired first is therefore set so as to be greater or longer than the time period for the remaining slices for which the MR data is acquired later.

The function with which the time period TI for the remaining slices is set as a function of the time gap between two SPAIR pulses adjacent in time may satisfy the following equation (1).

$$TI = a \times T1 \times \left(b - \lg\left(1 + e^{-\left(\frac{TR-SPAIR-c}{T1}\right)}\right)\right) + TIadd \quad (1)$$

Here, a (e.g. 0.77), b (e.g. 0.693) and c (e.g. 30) are constants which can be determined empirically. T1 is the longitudinal relaxation time and TIadd is an offset or an additional time interval over which the fat saturation can additionally be set. For example, TIadd=0 ms applies for maximum fat saturation and, for a weaker fat saturation, TIadd=25 ms can be selected. T1 is the time period between the SPAIR pulse and the RF excitation pulse and TR-SPAIR is the time gap between this SPAIR pulse and the SPAIR pulse immediately preceding it in time.

The longitudinal relaxation time T1 is a function of the magnetic field strength and is, for example, 230 ms (330 ms) for 1.5 T (3 T).

According to the invention, the time period for the at least one slice for which the MR data is acquired first may correspond to the further time period determined by the function, where infinity is assumed for the time gap TR-SPAIR.

A time gap of infinity between two SPAIR pulses adjacent in time means that the effect of the previous SPAIR pulse has died away completely when the current SPAIR pulse is emitted. When acquiring the MR data of the slice acquired first in time, only the SPAIR pulse which is emitted immediately before the RF excitation pulse exists, so the assumption that the time gap is equal to infinity is correct for the slice acquired first in time.

If for the time gap TR-SPAIR=∞ is inserted in equation (1), the following equation (2) is arrived at.

$$TI = a \times T1 \times b + TIadd \quad (2)$$

The time period for the at least one slice for which MR data is acquired first may thus, according to the previously described embodiment, correspond to the time period TI, which is determined according to equation (2).

According to a further preferred inventive embodiment, the time period $TI_i$ for the i-th slice, i.e. for that slice which is acquired as the i-th in time, is determined according to equation (3) below.

$$TI_i = \frac{1}{i} \times f(TR - SPAIR = \infty) + (i-1) \times f(TR - SPAIR) \quad (3)$$

Here, f(TR-SPAIR) corresponds to the previously described function with which the further time period or the time period TI for the remaining slices is determined as a function of TR-SPAIR, i.e. the time gap between the current SPAR pulse and the SPAIR pulse immediately preceding it in time.

According to equation (3), the time period $TI_i$ for the slice acquired first in time equals f(∞) (cf. also equation (2)), which is simultaneously the maximum value of the function f(TR-SPAIR). According to this, the later the respective slice is acquired (the greater the index i is), the more the time period TI decreases for the slices acquired subsequently in time.

According to the invention, it is however also possible to determine the time period between the SPAIR pulse and the RF excitation pulse for the at least one slice (in particular for the slice acquired first in time or for each of the slices acquired first in time (for which the MR data is recorded first in time)) empirically prior to the actual acquisition of the MR data such that the specified requirement for the fat signal or the fat saturation is fulfilled as well as possible.

In addition, it is also possible according to the invention to determine the time period between the SPAIR pulse and the RF excitation pulse for the at least one slice (in particular for the slice acquired first in time or for each of the slices acquired first in time) based on an analytical calculation or simulation of a time progression of the fat signal of the respective slice such that the specified requirement for the fat signal or the fat saturation is fulfilled as well as possible.

The time gap between two RF excitation pulses adjacent in time is preferably constant for all slices.

However, according to the invention it is also possible for the time period between two SPAIR pulses adjacent in time to be constant for all slices.

Within the scope of the present invention, a magnetic resonance system is also provided for fat saturation when acquiring MR data for a predetermined volume segment of an examination object. The magnetic resonance system has a basic field magnet, a gradient field system, at least one RF antenna and a control computer for actuating the gradient field system and the at least one RF antenna, for receiving measurement signals recorded by the RF antenna or RF antennas and for generating the MR data. The magnetic resonance system is designed so as to emit, via the at least one RF antenna, a SPAIR pulse and, at a predetermined time period later, an RF excitation pulse, in order to acquire the MR data. The magnetic resonance system is designed to set, though its control computer, the time period in the case of at least one slice differently from the time period for the remaining slices.

The advantages of the inventive magnetic resonance system here essentially correspond to the advantages of the inventive method, which have been explained in detail above.

Furthermore, the present invention encompasses a non-transitory, computer-readable data storage medium encoded with programming instructions, which can be loaded into a memory of a programmable controller or of a computing unit of a magnetic resonance system. The programming instructions cause the computer or processor to execute all or various previously described embodiments of the inventive method, when the programming instructions run in the controller or control computer of the magnetic resonance system. The storage medium may require other program means, e.g. libraries and auxiliary functions, in order to realize the corresponding embodiments of the method. The programming instructions may be in source code (e.g. C++), which must still be compiled and bound or which only has to be interpreted, or can be an executable software code, which for execution purposes only has to be loaded into the corresponding computing unit or control device.

The electronically readable data carrier can be, e.g., a DVD, a magnetic tape or a USB stick, on which electronically readable control information, in particular software (see above), is stored.

The present invention is employed, for example, in order to acquire a specified number of slices (e.g. 20 or 40), for example in the same breath. In this case, the time period TI for e.g. the first 5 slices of this concat (of the 20 to 40 slices) would be different (longer) than the time period for the remaining (15 to 35) slices. The same then applies to the next concat. In the next concat, the time period TI for the first slices will also be set differently from the time period TI for the remaining slices.

The present invention can be performed using single-shot methods, but also using multi-shot methods (here the MR data for the same slice is acquired with multiple RF pulses (in each case with a SPAIR pulse)).

The present invention achieves a significant improvement in fat saturation, in particular in single-shot acquisitions (e.g. HASTE ("Half fourier Acquisition Single shot Turbo spin Echo")), whereby it is not necessary to increase the measurement time, provided that the time gap between two RF excitation pulses adjacent in time is constant. This enables homogeneous fat saturation over the entire batch of slices.

The present invention is particularly suitable for fat saturation with the SPAIR pulse when acquiring the MR data in slices. The present invention is of course not restricted to this preferred area of application, since the present invention is at least in principle also suitable for fat saturation with a SPAIR pulse in three-dimensional (not slice-based) data acquisition.

The present invention is preferably employed with spin echo sequences, but can in principle also function with gradient echo sequences.

BRIEF DESCRIPTION OF THE DRAWINGS

FIG. 5 is a flow chart for the inventive method for fat saturation.

DESCRIPTION OF THE PREFERRED EMBODIMENTS

Figure 1:
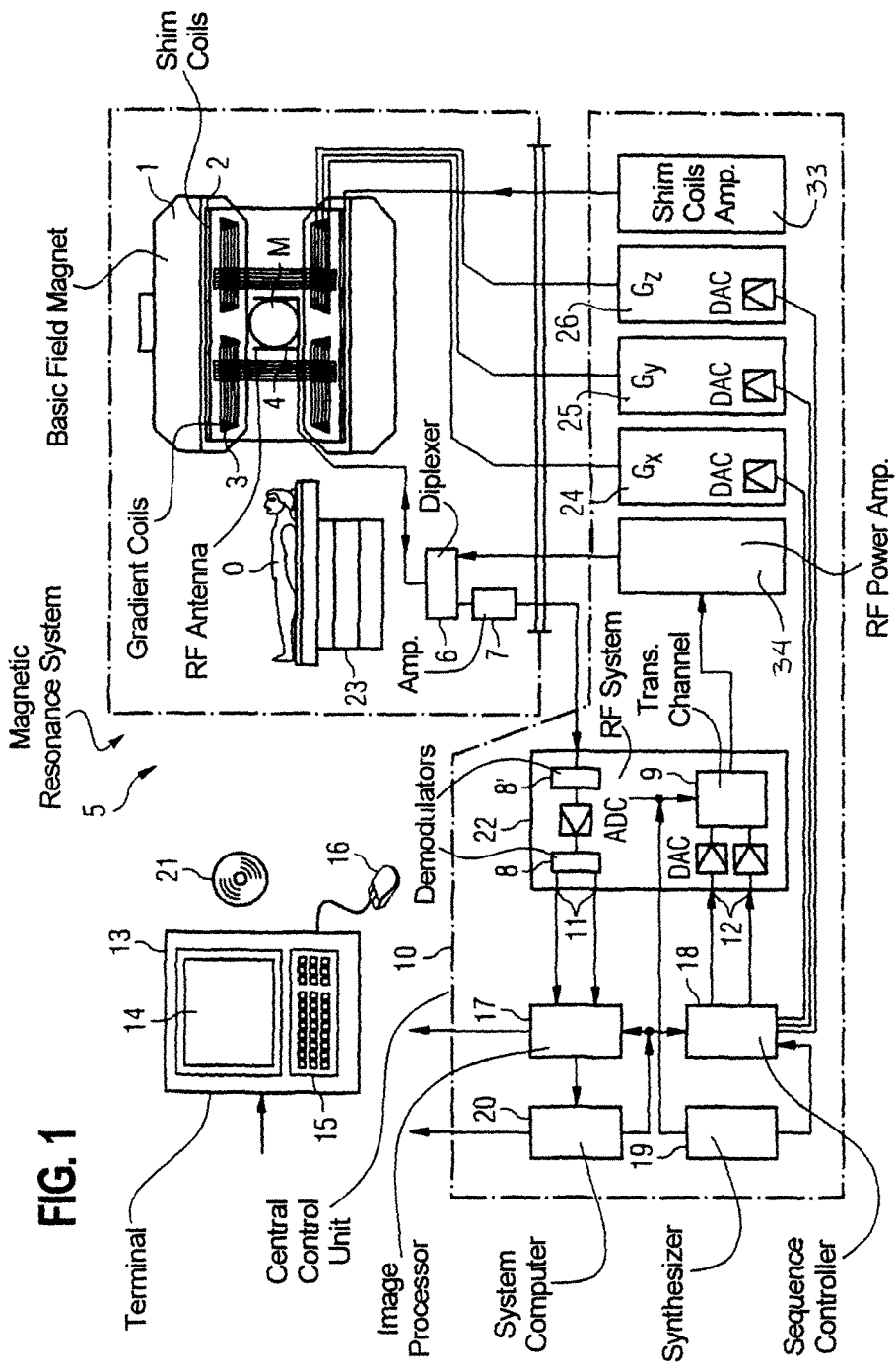
FIG. 1 schematically illustrates an inventive magnetic resonance system.

FIG. 1 is a schematic illustration of a magnetic resonance system 5 (a magnetic resonance imaging or nuclear spin tomography device). Here a basic field magnet 1 generates a strong magnetic field which is constant over time for polarization or orientation of the nuclear spins in an examination region of an object O, such as for example a part to be examined of a human body, which while lying on a table 23 is examined in the magnetic resonance system 5. The high level of homogeneity of the basic magnetic field needed for the nuclear spin resonance measurement is defined in a typically spherical measurement volume M, through which the parts to be examined of the human body are continuously pushed. To support the requirements for homogeneity and in particular to eliminate influences which are invariable over time the so-called shim sheets made of ferromagnetic material are attached at a suitable point. Influences which are variable over time are eliminated by shim coils 2, supplied with currently a shim coils amplifier 33.

A cylindrical gradient field system or gradient field system 3 is employed in the basic field magnet 1, and is composed of three such windings. Each such winding is supplied by an amplifier with current for generating a linear (also variable over time) gradient field in the respective direction of the Cartesian coordinates system. The first partial winding of the gradient field system 3 in this case generates a gradient $G_x$ in the x direction, the second partial winding a gradient $G_y$ in the y direction and the third partial winding a gradient $G_z$ in the z direction. The amplifier has a digital-to-analog converter which is triggered by a sequence controller 18 to generate properly timed gradient pulses.

Located within the gradient field system 3 is one (or more) radio-frequency antennas 4 which convert the radio-frequency pulses emitted by a radio-frequency power amplifier 34 into a magnetic alternating field for exciting the nuclei and orienting the nuclear spins of the object O to be examined or of the region of the object O to be examined. Each radio-frequency antenna 4 has of one or more RF transmitting coils and one or more RF receiving coils in the form of an annular, preferably linear or matrix-shaped, arrangement of component coils. The RF receiving coils of the respective radio-frequency antenna 4 also convert the alternating field emitted by the precessing nuclear spins, i.e. generally the nuclear spin echo signals produced by a pulse sequence comprising one or more radio-frequency pulses and one or more gradient pulses, into a voltage (measurement signal) which is fed via an amplifier 7 to a radio-frequency receiving channel 8 of a radio-frequency system 22. The radio-frequency system 22, which is part of a control device 10 of the magnetic resonance system 5, further has a transmitting channel 9 in which the radio-frequency pulses are generated for the excitation of the magnetic nuclear resonance. In this case the respective radio-frequency pulses are represented digitally in the sequence controller 18 as a sequence of complex numbers on the basis of a pulse sequence predefined by the system processor 20. This sequence of numbers is fed as a real part and an imaginary part via respective inputs 12 to a digital-to-analog converter in the radio-frequency system 22 and from this to a transmitting channel 9. In the transmitting channel 9 the pulse sequences are modulated up to a radio-frequency carrier signal, whose basic frequency corresponds to the resonance frequency of the nuclear spins in the measurement volume.

The switch from transmitting to receiving mode is effected by a transmit/receive diplexer 6. The RF transmitting coils of the radio-frequency antenna(s) 4 radiate the radio-frequency pulses into the measurement volume M to excite the nuclear spins and resulting echo signals are scanned via the RF receiving coil(s). The correspondingly obtained nuclear resonance signals are demodulated on a phase-sensitive basis to an intermediate frequency in the receiving channel 8' (first demodulator) of the radio-frequency system 22, digitized in the analog-to-digital converter (ADC) and emitted via the output 11. This signal is still demodulated to the frequency 0. The demodulation to the frequency 0 and the separation into real and imaginary parts takes place after digitization in the digital domain in a second demodulator 8. Using an image processor 17 an MR image is reconstructed from the measurement data obtained in this manner via an output 11. The administration of the measurement data, the image data and the control programs takes place via the system processor 20. On the basis of a parameter containing control programs the sequence controller 18 controls the generation of the respectively desired pulse sequences and the corresponding scanning of the K space. In particular the sequence controller 18 in this case controls the properly timed switching of the gradients, the transmission of the radio-frequency pulses with defined phase amplitude and the receipt of the nuclear resonance signals. The time basis for the radio-frequency system 22 and the sequence controller 18 is provided by a synthesizer 19. The selection of corresponding control programs for generating an MR image, which are stored for example on a DVD 21, and the display of the generated MR image are effected via a terminal 13 that has a keyboard 15, a mouse 16 and a monitor 14.

Figure 2:
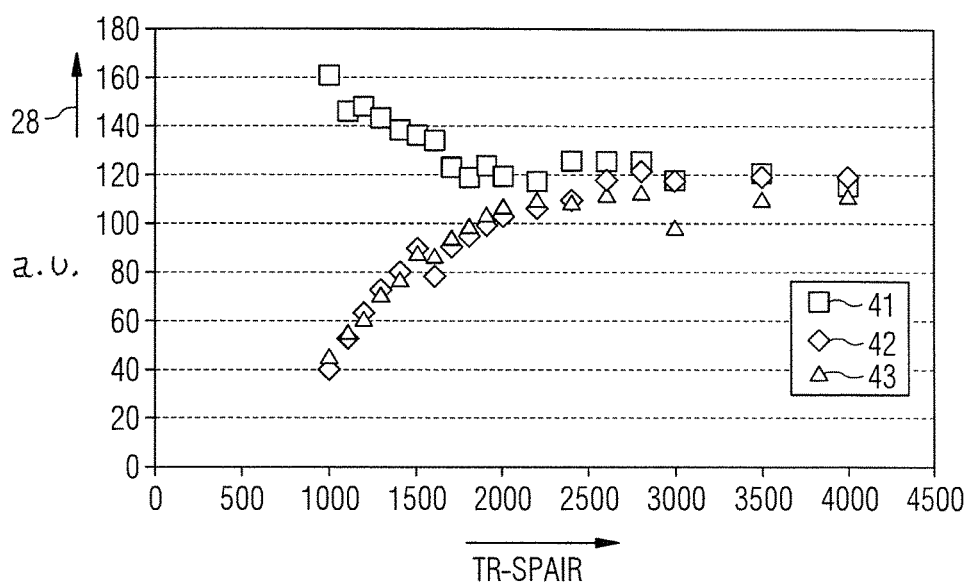
FIG. 2 illustrates the relationship between the fat signal and the time gap between the SPAR pulses.

FIG. 2 shows the fat signal 28 over the time gap between two SPAIR pulses adjacent in time. Here, the fat signal has in each case been represented as a function of the time gap TR-SPAIR for the slice 41 acquired first in time, for the slice 42 acquired second in time and for the slice 43 acquired third in time. The MR data were acquired using a single-shot method (i.e. the MR data for each slice were acquired based on just one RF excitation pulse preceded by a SPAIR pulse) with a HASTE sequence. It can be seen that precisely in the clinically relevant range from 1000 ms to 2000 ms there is a significant difference in the fat signal between the slice 41 acquired first in time and the slices 42, 43 acquired subsequently in time. It is precisely in this range that the inventive prolongation of the time period TI between the SPAIR pulse and the RF excitation pulse for the slice acquired first in time would ensure that the fat signal or fat saturation of the slice 41 acquired first in time at least approximates to the fat signal or fat saturation of the other slices 42, 43, in the case of which according to the invention a shorter time period TI would then be worked with than in the case of the first slice 41.

Figure 3:
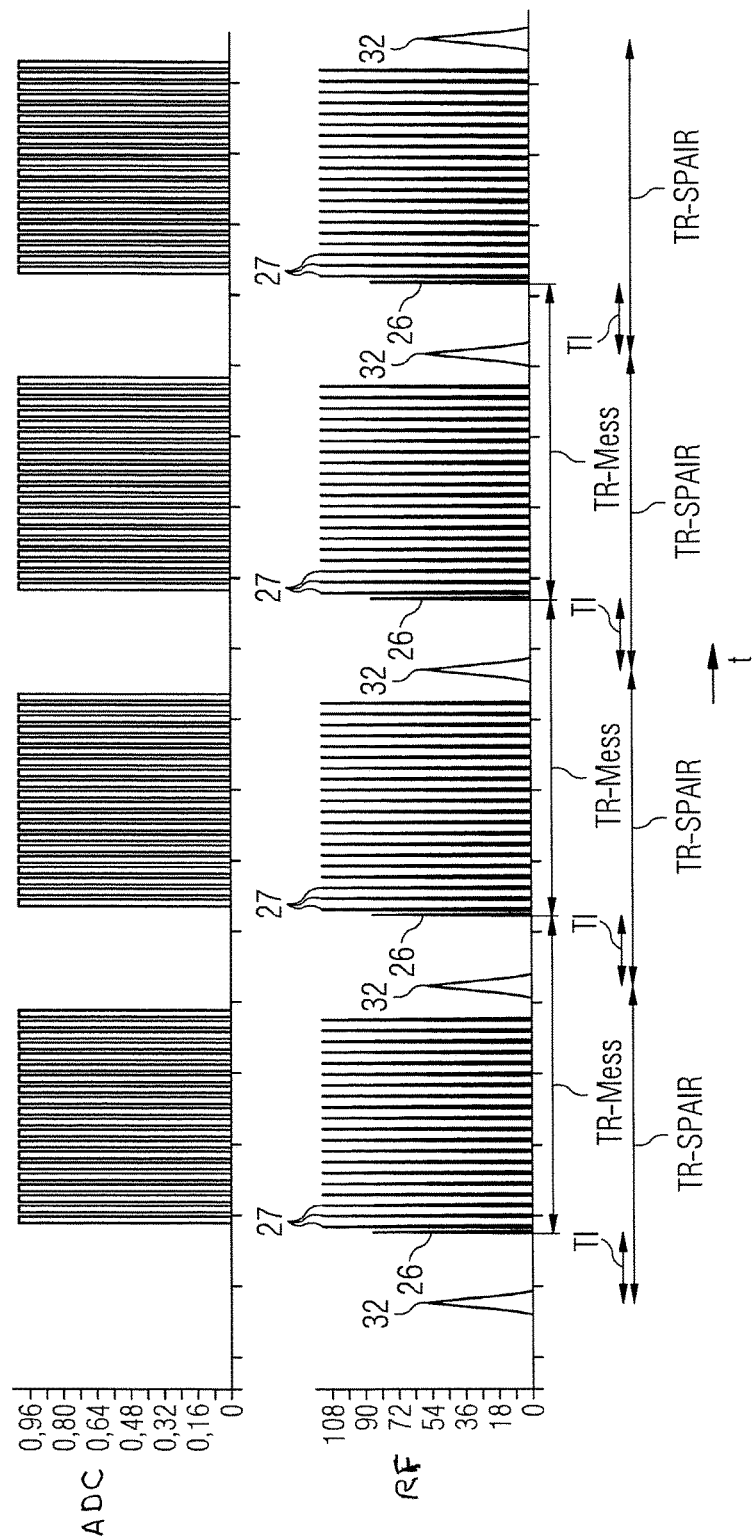
FIG. 3 shows an inventive sequence diagram for fat saturation and subsequent MR data acquisition.

FIG. 3 illustrates an inventive sequence for fat saturation when acquiring MR data of a volume section in slices.

Initially, for fat saturation a SPAR pulse 32 is emitted which is followed a customized time period TI later (also known as inversion time) by an RF excitation pulse 26 which is emitted in the case of a switched slice-selection gradient (not shown). Based on this RF excitation pulse 26, refocusing pulses 27 are switched, a k-space line of the first slice being read out after each refocusing pulse. The SPAR pulse 32 is frequency-selective and excites as far as possible only fat spins (i.e. spins of the fat tissue) and tips these through 180° or inverts them. A residual transverse magnetization can then be destroyed by means of a spoiler (not shown), which would be switched directly after the SPAR pulse 32 only in the direction $G_z$ of the basic magnetic field.

Once the MR data for the first slice has been acquired, a second SPAIR pulse is emitted, the time gap TR-SPAIR lying between SPAR pulses 32 succeeding one another in time. In turn, an RF excitation pulse 26 is emitted, in the case of a switched slice-selection gradient, the customized time period TI after the second SPAR pulse 32. Because the fat saturation generated by the first SPAR pulse 32 has not yet died away completely (i.e. the magnetization of the protons in the fat has not yet reached thermal equilibrium), the second time period TI after the second SPAIR pulse 32 is selected so as to be smaller than the first time period TI after the first SPAIR pulse 32. As when acquiring the MR data for the first slice, refocusing pulses 26 are emitted to acquire the MR data for the second slice. In the same way, after the MR data for the second slice is acquired, a third SPAIR pulse 32 is emitted which in turn is followed a customized third time period TI later by a third RF excitation pulse 26, the MR data for the third slice subsequently being acquired in the same way as for the first and second slices. This third time period TI is smaller than the preceding second time period TI, as the fat saturation at the time of emission of the third SPAIR pulse 32 is greater due to the previously emitted two SPAIR pulses than the fat saturation at the time of emission of the second SPAR pulse 32, which was preceded by a SPAIR pulse 32.

In principle, the acquisition of the MR data for the remaining slices proceeds in the same way as the acquisition of the MR data for the first to third slices. From a particular slice onward, for example from the slice acquired sixth in time, the time period TI is not changed any more and corresponds to the time period TI selected according to the prior art which is set as a function of the time gap TR-SPAIR, the time gap TR-SPAM being a function of the selected sequence protocol.

The time gap TR-Mess between two RF excitation pulses 26 adjacent in time is constant. For this reason, the time gap TR-SPAIR changes as a function of the time period TI.

Figure 4:
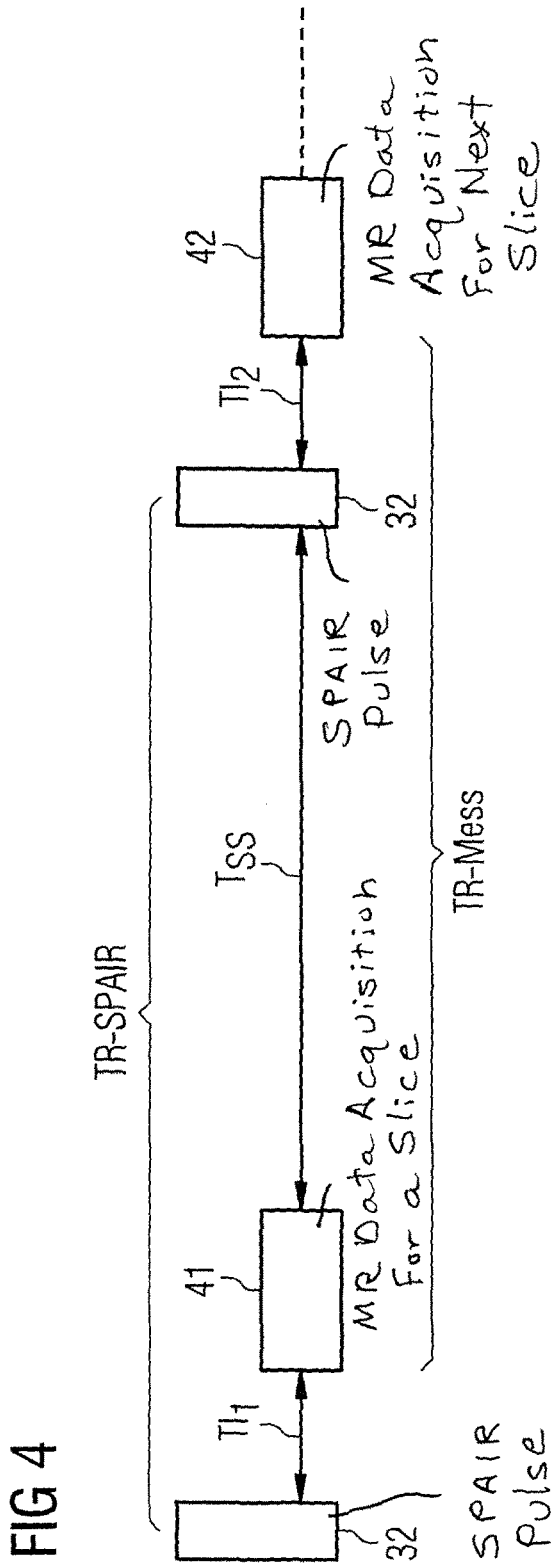
FIG. 4 shows schematically the time sequence of fat saturation with SPAIR pulse and of acquisition of the MR data.

FIG. 4 again illustrates schematically an inventive sequence, the emphasis here having been placed on the most important time intervals or time gaps or time periods. According to the invention, the time period $TI_1$, $TI_2$ between the SPAIR pulse 32 and the start of the subsequent acquisition of MR data for the corresponding slice 41, 42 is set such that the fat saturation of the acquired slices 41, 42 is as equal as possible. The start of acquisition of MR data for a slice 41, 42 is defined here as the time at which the respective RF excitation pulse 26 is emitted.

As the time gap TR-Mess between two RF excitation pulses 26 adjacent in time is usually constant, in the case of inventively determined time periods $TI_1$, $TI_2$ between the SPAIR pulse 32 and the start of the subsequent acquisition of MR data, the time gap TR-SPAIR must be variable.

In FIG. 5 a flow chart of an inventive method for fat saturation when acquiring MR data is illustrated.

In the first step S1, the optimum time periods TI between the SPAIR pulse and the following RF excitation pulse for the slices to be acquired first in time are determined. The time periods T1 between the SPAIR pulse and the following RF excitation pulse are set for the remaining slices as a function of the time gap TR-SPAIR between the SPAM pulse, which is emitted immediately prior to acquisition of the MR data for the respective slice, and the SPAIR pulse immediately preceding this SPAIR pulse in time.

The MR data for the slices of the volume segment to be acquired is acquired by means of steps S2 to S4. To this end, in each case in step S2 the SPAM pulse is emitted and, the corresponding time period TI (determined previously in step S1) after the SPAM pulse, the RF excitation pulse is emitted, before in the subsequent step S4 the MR data for the respective slice is acquired. After step S4, there is a jump in each case back to step S2 until the MR data for all the slices of the predetermined volume segment has been acquired in full. Then, in step S5, MR images are reconstructed as a function of the acquired MR data.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method for generating a magnetic resonance (MR) image, comprising:
   in a computer, designing an MR data acquisition pulse sequence comprising a Spectrally Adiabatic Inversion Recovery (SPAIR) pulse followed, after a predetermined time period, by a radio-frequency (RF) excitation pulse;

in said computer, generating control signals corresponding to said MR data acquisition sequence and providing said control signals to an MR scanner, comprising an RF radiator and a gradient coil system, in order to operate the MR scanner so as to execute the MR data acquisition sequence;

in said MR scanner, executing said MR data acquisition sequence according to said control signals so as to radiate said SPAIR pulse from said RF radiator for each slice among a plurality of slices in a predetermined volume of an examination subject situated in the MR scanner, and to radiate, for each of said slices, said RF pulse at said predetermined time period following said SPAIR pulse for that respective slice;

in said computer, generating said control signals so as to operate said MR scanner so as to execute said MR data acquisition sequence according to said control signals so as to operate said gradient coil system to acquire MR data, comprising a fat signal, from each of said plurality of slices, with said time period for at least one of said slices being different from said time period for others of said slices, by setting said time period in said computer for said at least one of said slices using a function of a time duration TR-SPAIR that exists between two of said SPAIR pulses that occur successively in time, in which function TR-SPAIR is assumed to be infinitely long, and acquiring said MR data respectively from said plurality of slices with a level of fat saturation, represented by said fat signal thereby being homogenized over said slices in said plurality of slices; and providing said MR data to an image reconstruction computer and, in said image reconstruction computer, reconstructing respective images of said slices with said homogenized levels of fat saturation.

2. A method as claimed in claim 1 comprising acquiring said MR data from said at least one slice first, before acquiring said MR data from said others of said slices.

3. A method as claimed in claim 1 comprising, in said computer, setting said time period for said at least one slice as a function of a predetermined requirement for said fat signal.

4. A method as claimed in claim 3 comprising, in said computer, using, as said predetermined requirement, a requirement that the fat signal represent as uniform a fat saturation as possible across all of said plurality of slices, or a requirement that the fat signal represents a maximum fat saturation for each slice in said plurality of slices.

5. A method as claimed in claim 1 comprising, in said control computer, setting said time period for said at least one slice to be longer than the time period for any of said others of said slices.

6. A method as claimed in claim 1 comprising, in said control computer, setting said predetermined time period to be TI for said others of said slices according to:

$$TI = a \times T1 \times \left(b - \lg\left(1 + e^{-\left(\frac{TR-SPAIR-c}{T1}\right)}\right)\right) + TIadd$$

wherein TR-SPAIR is said time duration, T1 is the longitudinal relaxation time of nuclear spins from which said MR data originate, and wherein a, b and c are empirically determined constants, and wherein TIadd is an additional time relevant to said requirement for fat saturation.

7. A method as claimed in claim 1 comprising, in said control computer, determining said predetermined time period to be TI for said at least one slice according to:

$$TI_i = \frac{1}{i} \times f(TR-SPAIR = \infty) + (i-1) \times f(TR-SPAIR)$$

wherein f(TR-SPAIR) is said function of said time duration TR-SPAIR, and wherein i is an index, and wherein TIi is the time period of an i-th slice, which is the i-th slice in time from which said MR data are acquired.

8. A method as claimed in claim 1 comprising, in said control computer, setting said time period for said at least one slice of a function of a predetermined requirement for said fat signal, and determining said time period empirically for said at least one slice until said requirement for said fat signal is satisfied.

9. A method as claimed in claim 1 comprising, in said control computer, setting said time period for said at least one slice of a function of a predetermined requirement for said fat signal, and determining said time period for said at least one slice by a calculation or simulation of a time progression of said fat signal of said at least one slice, said calculation or simulation requiring, as a calculation or simulation requirement, that said requirement for said fat signal be satisfied.

10. A method as claimed in claim 1 wherein said at least one slice is only one slice.

11. A method as claimed in claim 1 comprising operating said MR scanner from said control computer with a time duration between two consecutive RF excitation pulses being constant for all radiated RF excitation pulses.

12. A magnetic resonance (MR) apparatus comprising:
an MR data acquisition scanner comprising a radio-frequency (RF) radiator and a gradient coil system;
a computer configured to design an MR data acquisition pulse sequence comprising a Spectrally Adiabatic Inversion Recovery (SPAIR) pulse followed, after a predetermined time period, by a radio-frequency (RF) excitation pulse;
said computer being configured to generate control signals corresponding to said MR data acquisition sequence and to provide said control signals to said MR scanner in order to operate the MR scanner so as to execute the MR data acquisition sequence;
said MR scanner being configured to execute said MR data acquisition sequence according to said control signals so as to radiate said SPAIR pulse from said RF radiator for each slice among a plurality of slices in a predetermined volume of an examination subject situated in the MR scanner, and to radiate, for each of said slices, said RF pulse at said predetermined time period following said SPAIR pulse for that respective slice;
said computer being configured to operate said MR scanner so as to execute said MR data acquisition sequence according to said control signals so as to operate said gradient coil system to acquire MR data, comprising a fat signal, from each of said plurality of slices, with said time period for at least one of said slices being different from said time period for others of said slices, by setting said time period in said computer for said at least one of said slices using a function of a time duration TR-SPAIR that exists between two of said SPAIR pulses that occur successively in time, in which function TR-SPAIR is assumed to be infinitely long, and operate said gradient coil system so as to acquire said MR data respectively from said plurality of slices with a level of fat saturation, represented by said fat signal thereby being homogenized over said slices in said plurality of slices; and an image reconstruction computer provided with said MR data, said image reconstruction computer being configured to reconstruct respective images of said slices with said homogenized levels of fat saturation.

13. A non-transitory, computer-readable data storage medium encoded with programming instructions, said storage medium being loaded into a computer system of a magnetic resonance (MR) apparatus that comprises an MR data acquisition scanner having a radio-frequency (RF) radiator and a gradient coils system, and said programming instructions causing said computer system to:

design an MR data acquisition pulse sequence comprising a Spectrally Adiabatic Inversion Recovery (SPAIR) pulse followed, after a predetermined time period, by a radio-frequency (RF) excitation pulse;

generate control signals corresponding to said MR data acquisition sequence and provide said control signals to said MR scanner in order to operate the MR scanner so as to execute the MR data acquisition sequence;

operate said MR scanner so as to execute said MR data acquisition sequence according to said control signals so as to radiate said SPAIR pulse from said RF radiator for each slice among a plurality of slices in a predetermined volume of an examination subject situated in the MR scanner, and to radiate, for each of said slices, said RF pulse at said predetermined time period following said SPAIR pulse for that respective slice;

operate said MR scanner so as to execute said MR data acquisition sequence according to said control signals so as to operate said gradient coil system to acquire MR data, comprising a fat signal, from each of said plurality of slices, with said time period for at least one of said slices being different from said time period for others of said slices, by setting said time period for said at least one of said slices using a function of a time duration TR-SPAIR that exists between two of said SPAIR pulses that occur successively in time, in which function TR-SPAIR is assumed to be infinitely long, and acquire said MR data respectively from said plurality of slices with a level of fat saturation, represented by said fat signal thereby being homogenized over said slices in said plurality of slices; and reconstruct respective images of said slices with said homogenized levels of fat saturation.

* * * * *